United States Patent [19]

Pumphrey

[11] Patent Number: 5,139,376
[45] Date of Patent: Aug. 18, 1992

[54] METHOD AND APPARATUS FOR CONTROLLED PENETRATION DRILLING

[75] Inventor: Dennis M. Pumphrey, Torrance, Calif.

[73] Assignee: Excellon Automation, Torrance, Calif.

[21] Appl. No.: 780,881

[22] Filed: Oct. 23, 1991

[51] Int. Cl.$^5$ .................. B23B 35/00; B23B 41/00
[52] U.S. Cl. .................. 408/1 R; 364/474.28; 408/15; 408/95
[58] Field of Search .......... 408/1 R, 3, 13, 14, 408/15, 95, 98; 364/474.28, 474.35

[56] References Cited

U.S. PATENT DOCUMENTS

| | | | |
|---|---|---|---|
| 3,973,863 | 8/1976 | Smith | 29/568 |
| 4,088,417 | 5/1978 | Kosnowski | 408/1 R |
| 4,520,551 | 6/1985 | Imhof | 29/568 |
| 4,865,494 | 9/1989 | Dudow | 408/95 |
| 4,984,352 | 1/1991 | Reed et al. | 408/1 R |

FOREIGN PATENT DOCUMENTS

| | | | |
|---|---|---|---|
| 188207 | 7/1989 | Japan | 408/14 |
| 243210 | 9/1990 | Japan | 408/95 |

*Primary Examiner*—Daniel W. Howell
*Attorney, Agent, or Firm*—Knobbe, Martens, Olson & Bear

[57] ABSTRACT

A drilling machine and method of operation for drilling through holes in a workpiece while minimizing penetration of the drill tool into a back-up material which supports the workpiece. Before placing the workpiece on the machine, the vertical position of the back-up material is mapped. After selection of the drill site, the mapped position of the backup material proximate the drill site is retrieved. Using this information, a computer controller determines an absolute vertical position for a lower limit of the drill stroke. This lower limit is independent of the top of the workpiece or the thickness of the workpiece, thus eliminating the need to determine either of those values. The drill stroke is terminated once the drill tool reaches the lower limit, which is a nominal depth below the mapped position of the back-up material, insuring that a hole is completely drilled through the workpiece, while minimizing penetration of the back-up material. Also, vertical position sensors used for prior art depth control drilling can be used in the system disclosed.

19 Claims, 5 Drawing Sheets

METHOD AND APPARATUS FOR CONTROLLED PENETRATION DRILLING

FIELD OF THE INVENTION

The present invention relates generally to the field of printed circuit board drilling machines, and in particular to an improved method and apparatus for drilling printed circuit boards to more accurately control the amount of penetration of a drill tool into a back-up material which supports the printed circuit board being drilled.

BACKGROUND OF THE INVENTION

In the manufacture of printed circuit boards, frequently literally thousands of small holes must be drilled into each printed circuit board. In volume production of the circuit boards, the drilling of holes is accomplished by computer controlled automatic drilling machines in which the printed circuit boards are usually mounted on a worktable which is movable in a horizontal X-Y plane. A sheet of back-up material is typically mounted on top of the worktable, and beneath the printed circuit boards, so that the drill tool does not drill into the worktable upon passing through the underside of the printed circuit board.

Usually, the worktable moves horizontally to be positioned a spindle having a drill tool mounted therein, so that the holes may be drilled at appropriate drilling locations. Drilling of the circuit boards is accomplished by advancing each drill spindle downward through a vertical drilling stroke. The present invention relates to optimally controlling the termination of the downward stroke of the spindle.

A vital concern in the field of printed circuit board drilling machines is the speed with which a machine can drill holes. This is usually referred to as the productivity or "throughput" of a drilling machine. Although the time it takes to drill any single hole is relatively small, each circuit board drilled usually requires drilling thousands of holes, for example as many as 20,000 or more holes per board. Consequently, any small variance in the time to drill a single hole has a greatly multiplied effect and is very significant in the long term.

Another concern is that of minimizing drilling of the back-up material. When holes are drilled completely through a printed circuit board, the tool must penetrate the back-up material to some degree in order for the drill hole to be uniform throughout the entire depth of the circuit board. However, it is desirable to minimize the amount of penetration into the back-up material because the time required for such drilling lengthens the drill stroke and also causes wear of the drill. Further, circuit boards are commonly drilled in stacks. The deeper the hole is to be drilled, the longer the drill tool must be. In turn, the longer a drill tool is relative to its diameter, the more easily the tool will break. By decreasing the depth of tool penetration into the back-up material, shorter tools can be used for a given diameter hole, thus decreasing the likelihood of tool breakage.

Prior art through drilling techniques have not been satisfactory in satisfying these performance criteria. Prior art machines include a sensor to determine the vertical position of the drill spindle, and in turn the tip of the drill tool which extends a nominal distance from the spindle. One approach has been to simply drill to a preselected vertical position which is sufficiently deep to insure that the workpiece is fully drilled through. However, to accommodate several variables, the preselected depth must be so far beneath the top surface of the backup material to result in substantial amounts of unnecessary drilling of back-up. For example, the back-up material is not perfectly planar, and thus the position of its top surface can only be estimated. Further, due to drill wear, the precise position of the tip of the drill tool changes. During use the drill tools gradually become worn and thus they become measurably shorter over time. Prior to drilling into a workpiece, therefore, the vertical or Z-axis position of the tip of a worn drill tool is often higher than its expected position, namely, the Z-axis position of the tip of a new, unworn drill.

Using this prior art technique in a multi-spindle drilling machine, all the drill tools penetrate beyond the workpiece and into the back-up material below the workpiece so that even the worn drill tools will be ensured of drilling completely through the workpiece. As a result, unworn and only nominally worn drill tools drill unnecessarily deep into the back-up material, causing lost time during unnecessary drill movement. Additionally, drilling into the back-up material causes further wear of the drill tool, and causes loosened particles of the back-up material to be carried up into and embedded into the walls of the hole drilled in the workpiece, thereby decreasing the quality of the hole.

One solution to the above problem is to frequently replace all the drill tools on the drilling machine with new, unworn drill tools. This solution, however, is unnecessarily expensive and wastes drill tool which could otherwise be sharpened and reused.

Another approach has been to use a technique designed for drilling holes only partially through a workpiece, called "depth control drilling." In depth control drilling, the variance or "offset" in vertical position of a worn drill tool from the nominal position of a new drill tool is determined before drilling begins, so that the precise vertical position of the tip of the drill tool is known. When the drill stroke is commenced, the depth of the hole is measured from the top of the workpiece. This reference position is sensed when a pressure foot, which is attached to the drill spindle, engages the top of the workpiece. When the desired depth is reached, the drill stroke is terminated. This technique is adapted to through drilling by treating the depth of the hole to be drilled as equal to the thickness of the workpiece or stack of workpieces desired to be through drilled.

The shortcoming of using the depth control technique for through drilling is that sensing the vertical position of the top surface of the workpiece, from which the depth of the hole is measured, can be inexact. For example, inaccuracies arise due to debris on top of the workpieces. Likewise, an assumption must be made regarding the thickness of the workpiece which is being drilled in order to determine how deep the hole must be in order to drill completely through the workpiece. This assumption may be inaccurate since waviness in the workpieces can result in varying workpiece thicknesses depending on the location at which the hole is being drilled. These inaccuracies are multiplied when several printed circuit boards are stacked for through drilling. Also, debris between stacked workpieces can cause variation in workpiece thickness.

Thus a need exists for an accurate through drilling technique which insures that holes are drilled completely through the workpiece, while also minimizing unnecessary drilling of the back-up material.

SUMMARY OF THE INVENTION

The present invention is a method and apparatus for precisely controlling the depth of penetration of a drill tool into a backup material during through drilling. By minimizing drilling of back-up material, the present invention advantageously increases drilling machine throughput, decreases drill wear, and permits the use of drills having a greater diameter to length ratio.

A key feature of the present invention is the mapping of the back-up material before drilling to determine the precise vertical position of the back-up material. Preferably, measurements are taken along a grid and stored in a computer memory. During drilling, rather than measuring hole depth from the top of the workpiece down, with the inherent inaccuracies of prior art depth control drilling, the present invention involves setting hole depth at an absolute, predetermined vertical position. This predetermined position is arrived at by using the mapped position of the back-up material at or near the given drill site, and determining the absolute vertical position at a nominal depth below the top surface of the back-up material. Preferably, compensation for drill tool offset from a nominal position is also made, resulting in a fast and accurate through drilling system.

Briefly, the invention is embodied by a drilling machine which includes a spindle that is movable at least in a vertical direction. A drill tool is removably mounted in said spindle, which is adapted to cause rotation of the drill tool to effect drilling. A worktable, on which the workpiece is mounted, is positioned beneath the spindle, and movable in at least one direction in a horizontal plane so as position said workpiece at desired locations beneath the spindle. A back-up material having a top surface is mounted on top of the worktable with said top surface facing upwardly, toward said spindle, so that workpieces mounted on said worktable are positioned directly in contact with said top surface of said back-up material.

The apparatus includes a back-up material sensor device for sensing the vertical position of the back-up material top surface, and a storage device for storing data sensed by the back-up material sensor. A drill tool sensor device is provided for sensing the vertical position of said drill tool. Also provided are means for controlling the vertical displacement of the spindle during a drill stroke. The control means is adapted to determine an absolute vertical position for the tool tip at a lower limit of a drill stroke and to terminate said drill stroke when the tool tip reaches that lower limit. The absolute vertical position is determined using the data regarding the vertical position of the back-up material top surface in the storage device, so that said lower limit is at least as deep as the vertical position of the top surface of said back-up material. As a result, the control means minimizes drill penetration into the back-up material, while at the same time ensuring that the drill tool has completely drilled through said workpiece.

The inventive method includes the steps of sensing the vertical position of the back-up material top surface; storing the data sensed regarding the vertical position of the top surface of the back-up material; determining an absolute vertical position of the tool tip at a lower limit of a drill stroke using the stored data regarding the vertical position of the back-up material top surface, so that the lower limit is a nominal distance below the back-up material top surface; initiating a drill stroke by downward vertical motion of the spindle; sensing the vertical position of the tip of the drill tool during the drill stroke; and terminating the drill stroke when said drill tool has reached the predetermined absolute vertical position so that drill penetration into said back-up material can be minimized, while at the same time ensuring that said drill tool has completely drilled through said workpiece.

DESCRIPTION OF THE PREFERRED EMBODIMENT

Figure 1:
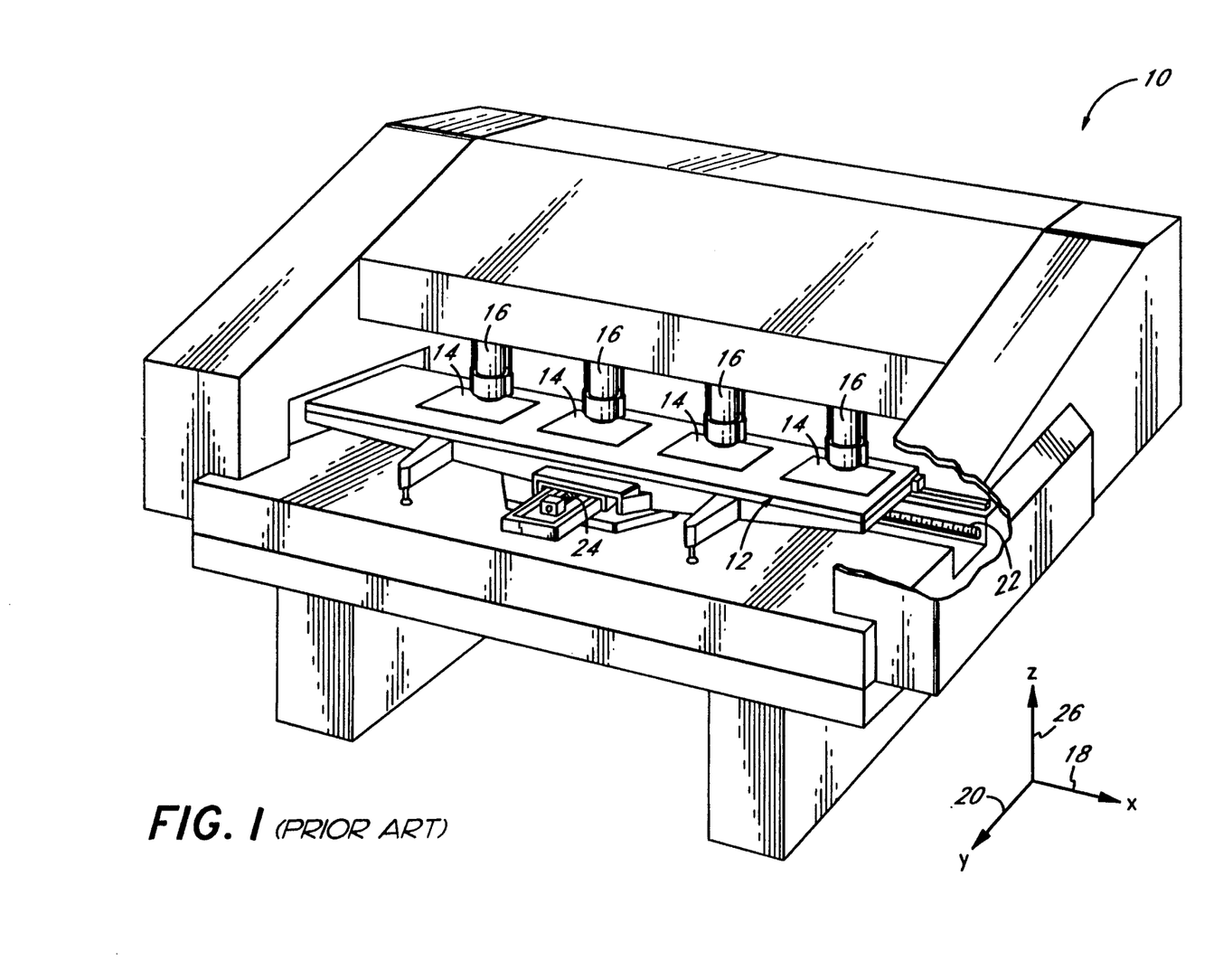
FIG. 1 is a perspective view of a typical multi-spindle printed circuit board drilling machine.

Referring to FIG. 1, a typical printed circuit board drilling machine 10 is shown. The drilling machine 10 includes a worktable 12 on which workpieces, such as printed circuit boards 14 are mounted. Above the worktable 12, one or more spindles 16 are mounted on a carriage (not shown). The worktable 12 is movable in a horizontal plane defined by an X-axis 18 and a Y-axis 20. Preferably, the worktable 12 is movable parallel to either axis 18, 20. The worktable 12 is displaced by the rotation of motor driven lead screws 22 and 24, which are parallel to the X and Y axes, respectively. As is known in the art, positioning of the worktable 12 relative to the spindle 16 on a drilling machine can be achieved by alternate arrangements, such as moving by the spindle 16 in one direction along the X-Y plane and moving the worktable 12 in the other direction.

Figure 2:
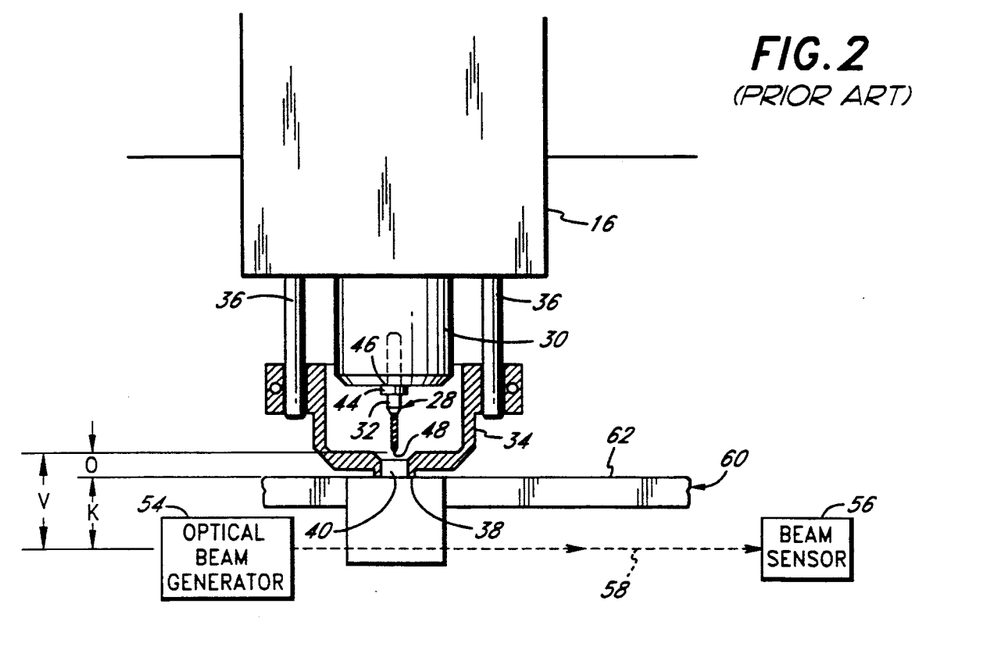
FIG. 2 is a partially cross-sectioned elevational view of a prior art drill spindle and tool offset measuring device.
Figure 6:
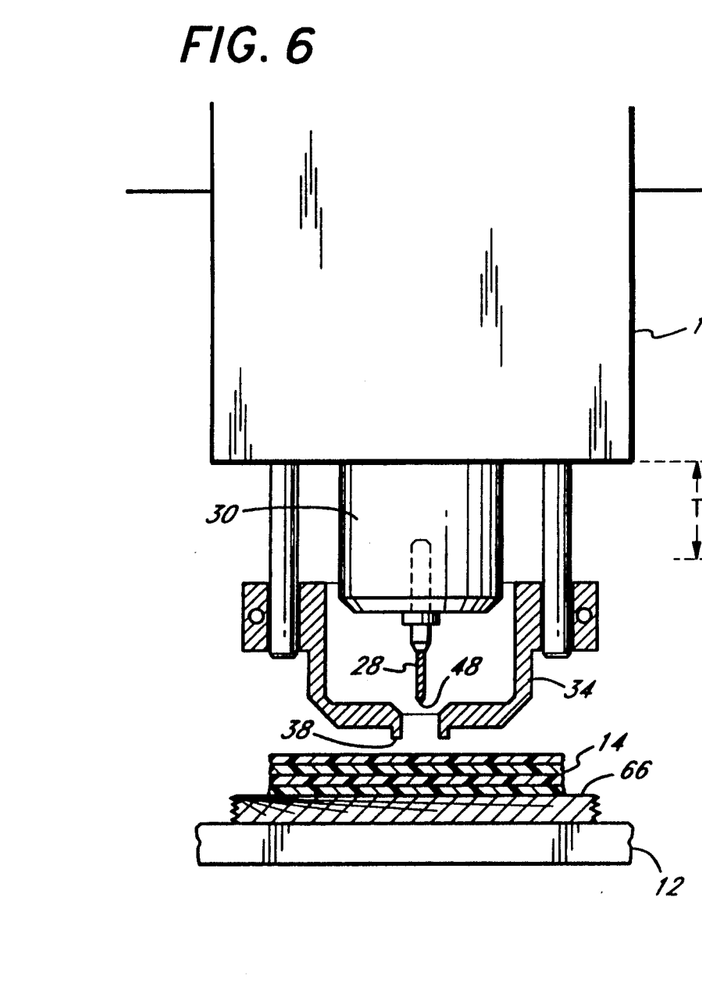
FIG. 6 is a partially cross-sectioned elevational view of a drilling machine according to the present invention during the initiation of a drill stroke.
Figure 7:
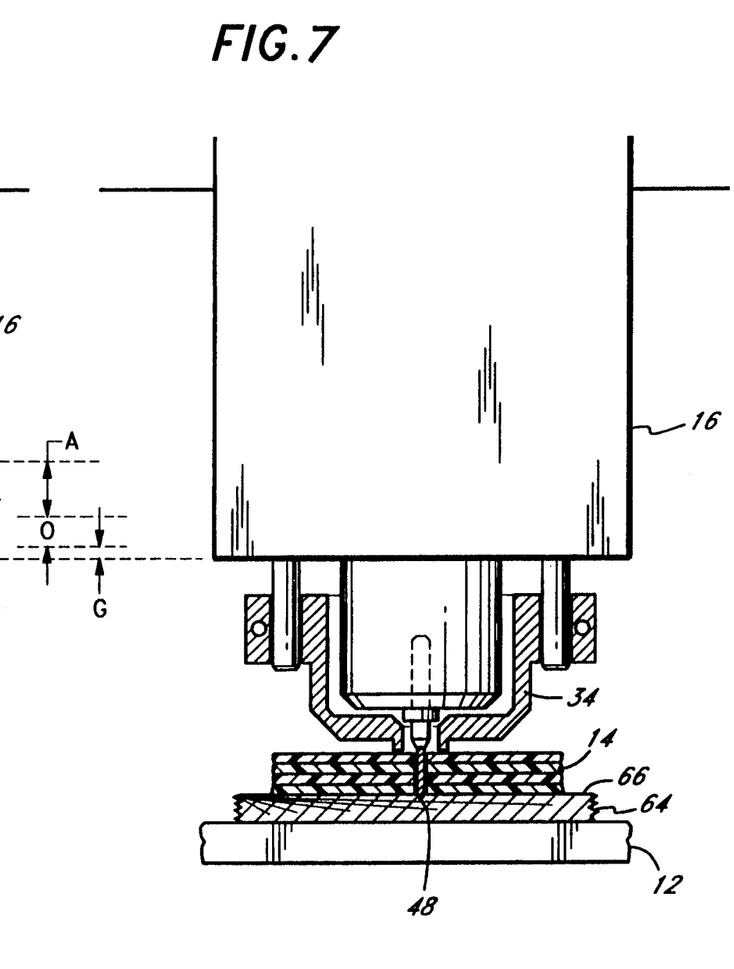
FIG. 7 is a partially cross-sectioned elevational view of a drilling machine according to the present invention at the termination of a drill stroke.

The spindles 16 are movable in a vertical direction, parallel to a Z-axis 26. Although not shown, the spindles 16 are displaced by a motor driven lead screw arrangement of a type well known by those skilled in the art. The spindle vertical drive mechanism 27 is represented schematically in FIG. 3. As is seen in FIGS. 2, 6 and 7, a drill tool 28 is mounted in the spindle 16 so that the drill 28 depends from the bottom of the spindle 16. A collet 30 on the spindle 16 grips a cylindrical shank 32 of the tool 28. The spindle 16 is driven by a motor (not shown) to cause rotation of the drill tool 28 to effect drilling.

A pressure foot 34 is mounted beneath the spindle 16, and is movable relative to the spindle 16 in a vertical direction. The pressure foot 34 is joined to the spindle 16 by cylindrical rods 36 which are pneumatically biased so that the pressure foot 34 is forced downwardly, away from the spindle 16. A bottom surface 38 of the pressure foot 34 engages the top of the workpiece 14 during drilling operations, as shown in FIG. 7. During drilling, the spindle 16 is driven downwardly so that the pressure foot bottom surface 38 engages the workpiece 14. The downward force of the spindle 16 easily overcomes the biasing force on the rods 36, so that the spindle 16 continues to move vertically downwardly, and also begins to moves downwardly relative to the pressure foot 34. Continued downward movement of the spindle 16 causes the drill tool 28 to pass through an aperture 40 in the pressure foot 34, as is best seen in FIG. 7. Relative motion between the spindle 16 and pressure foot 34 is sensed by means of a relative motion sensor 42, shown schematically in FIG. 3. Preferably, the relative motion sensor 42 is an optical limit switch.

An annular collar 44 is press fit onto the drill shank 32. A top surface 46 of the collar 44 abuts the collet 30. The collar 44 is positioned on the drill 28 so that the distance between the collar top surface 46 and a tip 48 of the drill tool 28 is a nominal value. Thus, the vertical position of the tool tip 48 is known relative to the spindle 16. The absolute Z-axis position of the spindle 16 is sensed by a spindle vertical position sensor 50, as shown schematically in FIG. 3. Those skilled in the art will appreciate that a variety of devices can be used to function as a vertical position sensor 50. Output from the vertical position sensor 50 is fed to a computer controller 52. Thus, the vertical position of the tool tip 48 is known by the controller 52 at all times. The controller 52, which monitors various functions of the drilling machine 10, is preferably a digital computer which utilizes, for example, a Motorola 68020 chip as a CPU.

Figure 3:
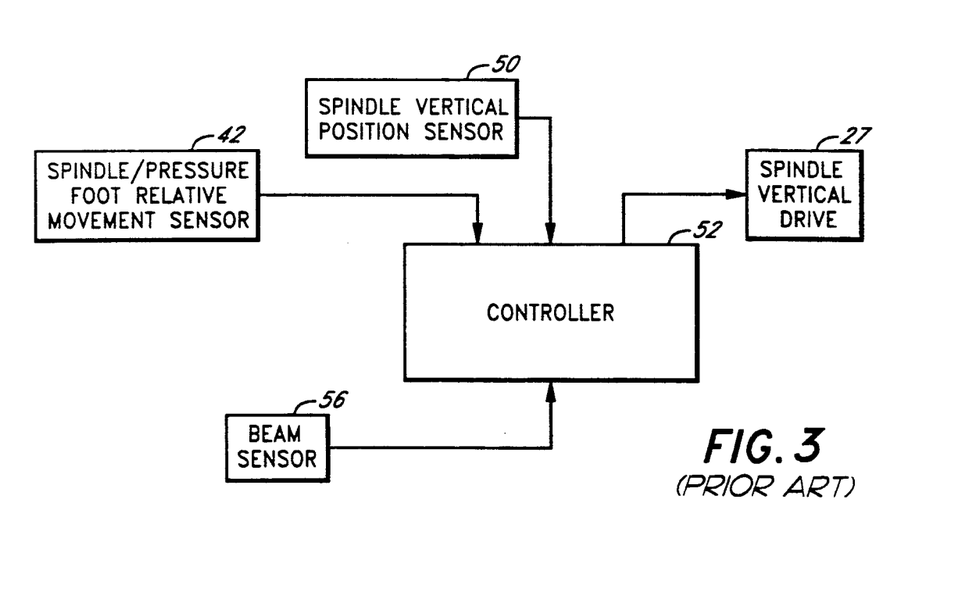
FIG. 3 is a block diagram of prior art spindle and tool position sensors and a controller.

Knowing the vertical position of the spindle 16, and the distance from the collar 44 to the tool tip 48, the vertical position of the tool tip 48 is known. However, due to wear of the drill tool 28, and inaccuracies in the placement of the collar 44 on the drill tool 28, the actual vertical position of the tool tip 48 may vary from the nominal position. Prior art systems have been developed to accommodate for these variations during depth control drilling. Such a prior art drill tool measuring device is shown in FIGS. 2 and 3. The device includes an optical beam generator 54 and an optical beam sensor 56. An optical beam 58 is generated by the beam generator 54. The sensor 56 determines when the beam 58 is occluded by the drill tool 28, and transmits this information to the controller 52.

Referring to FIG. 2, a tooling plate 60 having a planar upper surface 62 is mounted on the worktable 12. A distance between the upper surface 62 of the plate 60 and the sensor beam 58 is a known, factory preset value represented by the reference character "K". To measure the precise location of the tip 48 of the drill tool 28, the tool measuring device is positioned below the spindle 16, and then the spindle 16 is moved downwardly. When the pressure foot 34 engages the upper surface 62 of the plate 60, the relative motion sensor 42 sends a signal to the controller 52, and a distance counter in the controller 52 is begun.

The spindle 16 continues to move down, and relative to the pressure foot 34, while the pressure foot 34 remains stationary on the plate 60. The amount of relative movement of the spindle 16 is measured by the distance counter in the controller 52 until the drill tool tip 48 interrupts the sensor beam 58. The counter value now represents the distance traveled by the spindle 16 between engagement of the pressure foot 34 with the plate 60 and intersection of the tool tip 48 with the beam 58. This distance is designated by the reference character "V," shown in FIG. 2. The value V is used by the controller 52 to derive a tool tip offset for the drill tool 76 which is designated by the reference character "O". Specifically, O is determined by the formula $V - K = O$.

The offset O represents the distance from the drill tool tip 48 to the bottom of the pressure foot 38 when the spindle 16 is in a home position. The home position or "upper limit" is a predetermined Z-axis point which is known by the controller 52 and to which the spindles 16 return after completion of each drill stroke. During measuring of the tool tip position, the spindle 16 is initially set at the home position prior to moving the spindle downward to interrupt the sensor beam 58. Thus, when the pressure foot 34 initially contacts a top surface of a printed circuit board 14 during a drill stroke, the value O also represents the distance from the drill tool tip 48 to the top surface of the circuit board 14 at the moment the relative movement sensor 42 senses displacement of the spindle 16 relative to the pressure foot 34. The tool tip measurement technique described above generally is used each time a drill tool 28 is changed so that the precise position of the tool tip 48 can be accommodated for during drilling.

In prior art depth control drilling, the vertical position of the tip of the drill tool must be known in order to determine how far the spindle must travel along the Z-axis for the tool tip to penetrate the workpiece to the desired depth. The first step in depth control drilling is to conduct the tool tip measurement described above with reference to FIG. 2. Then, starting the drill stroke with the spindle in the known home position and with the workpiece in position on the worktable, the spindle is first moved vertically downward until the relative motion sensor 42 indicates that the pressure foot bottom surface 38 has engaged the workpiece. From that point, the controller signals the spindle vertical drive mechanism 27 to move downwardly a distance equal to the offset O plus an amount "H"(not shown), where H represents the amount of desired penetration below the top surface of the workpiece 14. The offset O is determined during the tool tip measurement process described above with reference to FIG. 2, and is a sufficient distance to bring the tool tip 44 into contact with the top of the workpiece. The value of H is predetermined and is input to the controller 52 by the user before the drilling operation begins.

This prior art depth control drilling technique has also been used for through drilling. The only difference is that the value of H is preselected to approximate the thickness of the workpiece or stack of workpieces in which the through hole is to be drilled. However, since the depth of the hole drilled is determined relative to the location of the workpiece top surface (i.e., where the relative motion sensor first trips), debris between the workpiece and the pressure foot can affect the accuracy of the depth of the hole drilled. Likewise, since the thickness of the stack of workpieces must be known in order to determine the value of H, debris between the circuit boards themselves can impact the depth of the hole drilled. Further, waviness in the printed circuit boards themselves can result in variations in the depth of the hole which must be drilled.

In the present invention, the amount of spindle displacement required to drill a through hole is determined as an absolute Z-axis position, and is not relative to the top of the workpiece or a function of the workpiece thickness. Thus, the disadvantages of using depth control drilling techniques for drilling through holes is overcome. However, the same hardware shown in FIG. 1-3 can be utilized in the present invention.

Figure 4:
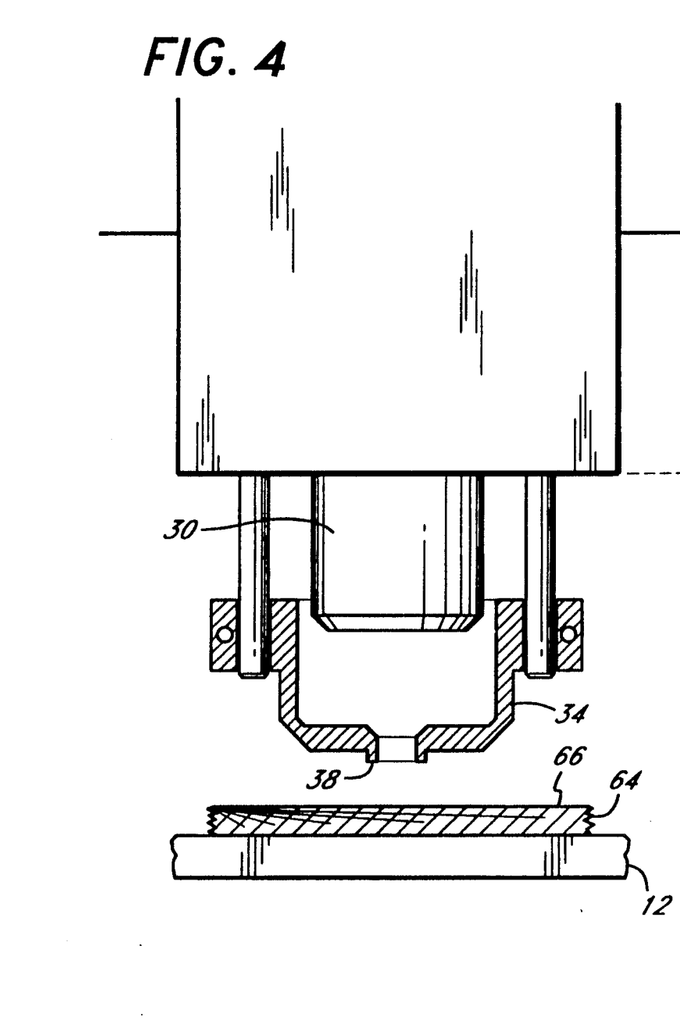
FIG. 4 is a partially cross-sectioned elevational view of a drilling machine according to the present invention during mapping of the back-up material, with the spindle in the home position.

Referring to FIG. 4, in a drilling machine according to the present invention, a substantially planar sheet of a back-up material 64 is mounted on top of the worktable 12, with a top surface 66 of the back-up material 64 facing the spindle 16. The back-up 64 is preferably formed of a composite material. Before a workpiece is placed on top of the back-up 64 for drilling, the vertical position of the top surface 66 is mapped. As shown in FIG. 4, the mapping may be conducted before the tool is placed in the collet. Since the thickness of the back-up material is consistent, preferably the mapping need not be redone except when the drilling machine is realigned or when the backup material is replaced with a different kind of material.

Figure 5:
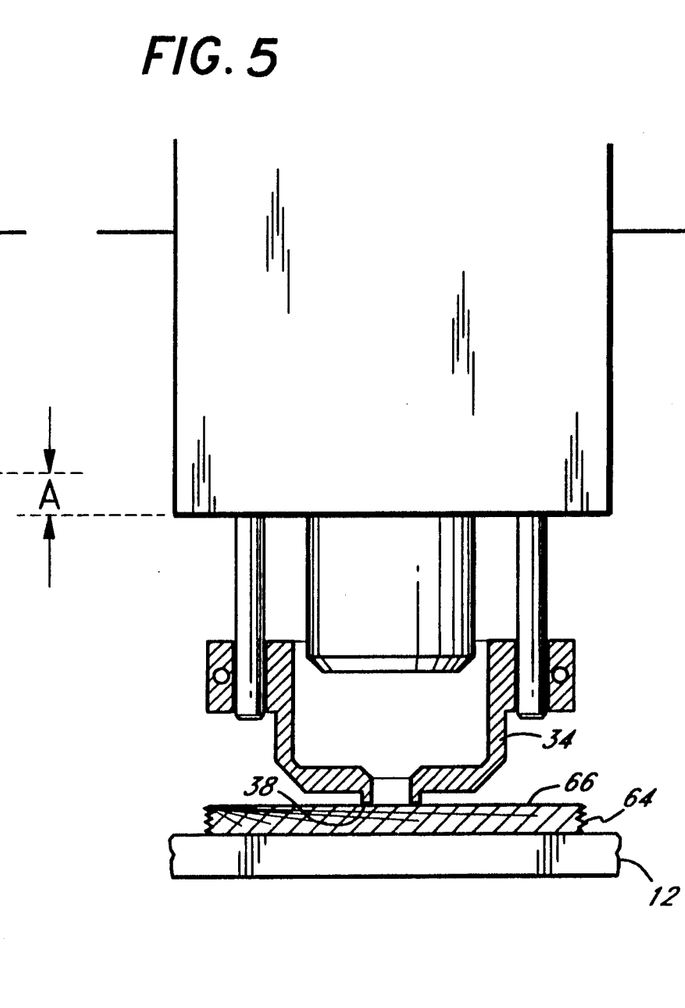
FIG. 5 is a partially cross-sectioned elevational view of a drilling machine according to the present invention during mapping of the back-up material, with the spindle lowered so that the pressure foot is in contact with the back-up material.

As shown in FIG. 4, to conduct mapping, the worktable 12 is first positioned beneath the spindle 16 at a known location in the horizontal X-Y plane, with the spindle 16 in the home position. The spindle 16 is then lowered until the pressure foot bottom surface 34 engages the back-up material top surface 66, as shown in FIG. 5. Contact between the pressure foot 34 and the back-up material 64 is sensed by the relative motion sensor 42, since at the point of contact, relative motion between spindle 16 and pressure foot 34 will begin. This is represented as the first step 68 in the flow chart of FIG. 8.

During the lowering of the spindle 16, the absolute vertical position of the spindle 16 at the point of contact with the back-up material 64 is sensed by the vertical position sensor 50. The distance travelled by the spindle 16 from the known home position to the point of contact with the back-up material 64 is represented in FIGS. 4 and 5 by the character "A." The value of A is stored in memory in the controller 52, as indicted by step 70 in FIG. 8, and is representative of the vertical position of the back-up material top surface 66 at the particular location at which the pressure foot engages the back-up material.

Preferably, this step of mapping the vertical position of the back-up material is repeated for a variety of locations on the back-up material which form a grid. The grid is orthogonal, for example, with a two inch spacing between the measured locations. A map of data regarding the topology of the back-up material top surface 66 is thus generated and stored in memory in the controller 52.

It will be apparent to those skilled in the art that the mapping could be conducted using alternate means, such as optical scanning. However, the preferred system disclosed has an advantage in that no additional hardware is required to conduct the mapping. Further, during mapping the spindle applies substantially the same force to the back-up material 64 and worktable 12 as is applied during actual drilling operations. Thus, any deflection of the worktable 12 induced by the spindle 16 during drilling will be repeated during the mapping step. Advantageously, this permits the use of worktables which have a lower mass and thus can be moved more quickly, as inaccuracies resulting from the increased flexibility of a low mass worktable are compensated for during mapping.

Figure 8:
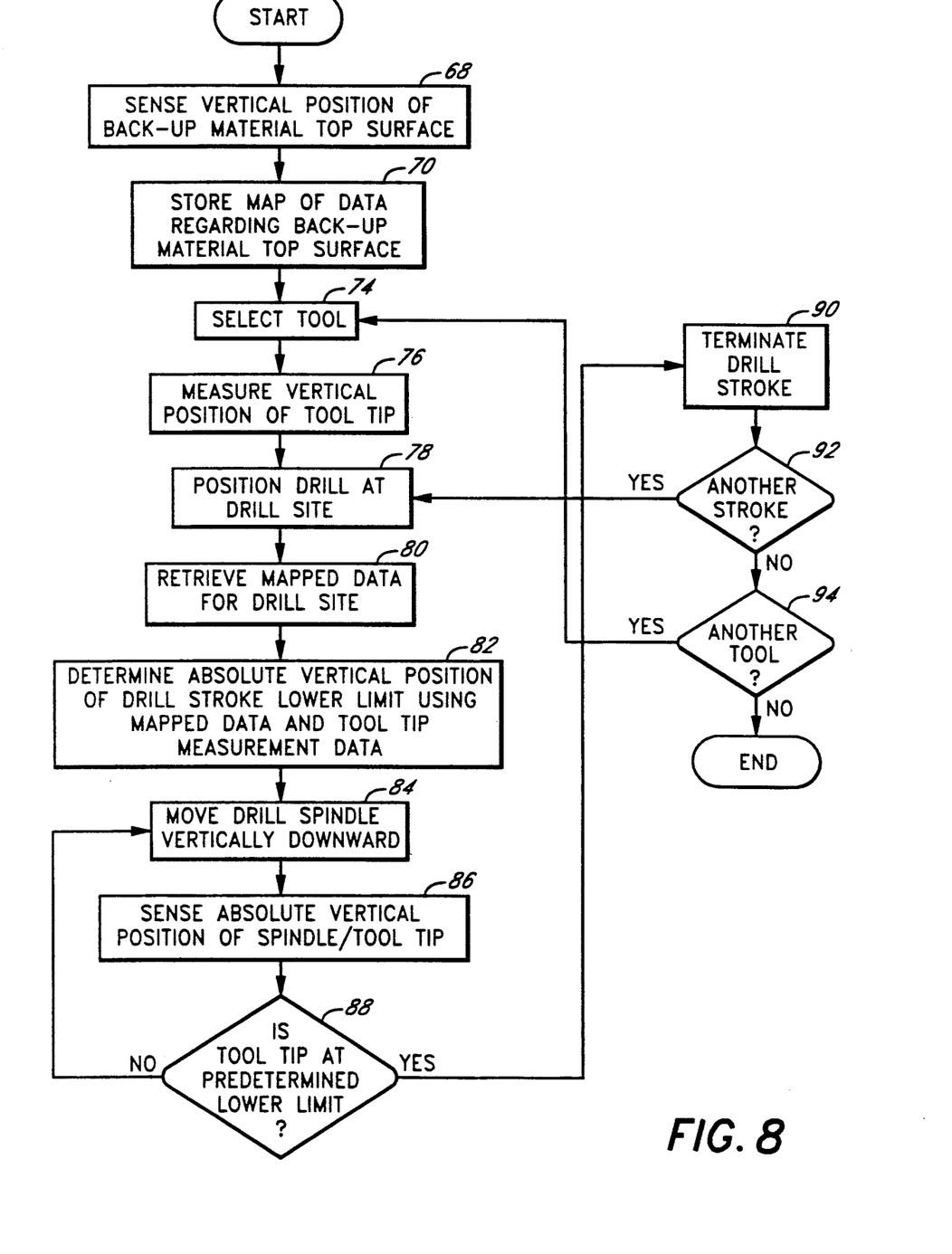
FIG. 8 is a flow chart illustrating the operation of a drilling machine according to the present invention.

The next step 74 shown in FIG. 8 is to select a tool 28 to be used for drilling, and to place that tool 28 in the collet 30. The tool 38 may be selected automatically using known automatic tool changing devices (not shown), for example such as those disclosed in U.S. Pat. No. 3,973,876 to Smith and U.S. Pat. No. 4,520,551 to Imhof, the disclosures of which are hereby incorporated by reference.

As indicated by step 76 in FIG. 8, the present invention also preferably utilizes the same tool tip measurement system discussed above with respect to FIG. 2. Thus, after a drill tool is placed in the collet 30, the tool tip position is measured to accommodate for variation from the nominal tool tip position. A value for the offset O is thus stored by the controller 52. Of course, if the vertical position of the drill tool tip 48 can be fixed at a predetermined position relative to the spindle, then the need for measuring the tool tip position is not necessary. For example, if new tools are used to the exclusion of resharpened tools, it can be assumed that the tool tip 48 is always a known nominal distance from the collar 44, which in turn abuts the collet 30.

Drilling according to the present invention is shown in FIGS. 6 and 7. A plurality of workpieces 14 are shown stacked on the back-up material top surface 66. The worktable 12 is positioned relative to the spindle 16 so that the spindle is above the desired drill site, as indicated by step 78 in the FIG. 8 flowchart. In FIG. 6, the spindle 16 is in the home position just before commencement of the drill stroke. Before signalling the spindle drive 27 to lower the spindle 16, the controller 52 determines the absolute Z-axis position of the spindle at a lower limit of the drill stroke. This lower limit is preferably at a position which is a nominal depth below the back-up material top surface 66, so that drill penetration into the back-up material can be minimized, while at the same time ensuring that the drill tool 28 completely drills through the workpiece.

To determine the lower limit, the stored data regarding the vertical position of the back-up material top surface is retrieved by the controller 52, as indicated at step 80 in the flowchart. In particular, the value of the mapped distance A is retrieved for the location along the mapped grid which is closest to the drill site. The value of the tool tip offset O derived from the tool tip measurement process described above is added to A. The combined value of A and O represents the amount of vertical displacement of the spindle 16 required to lower the tool tip 48 from the home position to a position flush with the back-up material top surface 66. Since it is desirable to drill into the back-up material by a nominal distance, a predetermined value for the penetration of the drill tool into the back-up material, represented by the character "G," is also added to O and A. Thus, O, A, and G are summed by the controller to determine the total vertical displacement 'T' of the spindle required from the home position to reach a lower limit at which penetration of the drill into the back-up material will be optimized. Determination of this total displacement is represented by step 82 in FIG. 8. This total displacement T is indicated in FIGS. 6 and 7, which illustrate the spindle at the home position and at the predetermined lower limit, respectively.

After determining the lower limit, the controller 52 instructs the spindle drive 27 to start the drill stroke by lowering the spindle 16, as indicated at step 84 in FIG. 8. During the drill stroke, the vertical position sensor 50 transmits information to the controller 52 regarding the absolute vertical position of the spindle 16, as shown by step 86 on the flowchart. As indicated by step 84, during the drill stroke the controller 52 compares the vertical position of the spindle 16 with the lower limit value which was determined in step 82. If the lower limit has not been reached, the spindle continues to be lowered. When the spindle 16 reaches the lower limit, as shown in FIG. 7, the drill tool tip 48 has penetrated the back-up material 64 by a nominal amount G. The controller 52 then terminates the drill stroke by signalling the spindle drive 27 to retract the spindle vertically upward to the home position, as represented in step 90.

The controller next determines in step 92 whether to conduct additional drill strokes using the same tool, in which case the drilling process is repeated beginning at step 78. If no further holes are to be drilled using the same tool, the controller determines in step 94 whether to continue drilling with another tool, in which case the process is repeated beginning at step 74, or whether to end the drilling process.

The process shown in FIG. 8 and described above is conducted separately for each spindle in a multi-spindle machine.

As will be appreciated by those skilled in the art, the preferred embodiment described above is just one example of how the present invention can be implemented, and that variations from the preferred embodiment will still be within the scope of the invention, as defined by the claims below. For example, the precise sequence of steps shown in FIG. 8 may be varied while still remaining within the scope of the invention.

What I claim is:

1. A drilling machine in which the depth of a hole drilled completely through a workpiece can be precisely controlled to decrease drill wear and to improve the throughput of said drilling machine, said drilling machine comprising:

a spindle movable at least in a vertical direction, a drill tool removably mounted in said spindle, said spindle being adapted to cause rotation of said drill tool to effect drilling;

a worktable positioned beneath said spindle, said worktable adapted to have a workpiece mounted thereon, said worktable being movable in at least one direction in a horizontal plane so as position said workpiece at desired locations beneath said spindle;

a back-up material having a top surface, said back-up mounted on top of said worktable with said top surface facing upwardly, toward said spindle, so that workpieces mounted on said worktable are positioned directly in contact with said top surface of said back-up material;

a back-up material sensor device for sensing the vertical position of said top surface of said back-up material;

a storage device for storing data sensed by said back-up material sensor regarding the vertical position of said top surface of said back-up material;

a drill tool sensor device for sensing the vertical position of said drill tool; and means for controlling the vertical displacement of said spindle during a drill stroke, said control means adapted to determine an absolute vertical position for said tool tip at a lower limit of a drill stroke and to terminate said drill stroke when said tool tip reaches said lower limit, said absolute vertical position being determined using the data regarding the vertical position of the back-up material top surface in said storage device, so that said lower limit is at least as deep as the vertical position of the top surface of said back-up material, said control means minimizing drill penetration into said back-up material, while at the same time ensuring that said drill tool has completely drilled through said workpiece.

2. The drilling machine of claim 1, wherein said back-up material sensor device is mounted on said spindle.

3. The drilling machine of claim 2, wherein said back-up material sensor device comprises:

a pressure foot depending from said spindle, said pressure foot having a bottom surface which is adapted to engage said back-up material top surface, said pressure foot being movable relative to said spindle in vertical direction; and a relative motion sensor which senses relative vertical motion between said spindle and said pressure foot.

4. The drilling machine of claim 3, wherein the back-up material sensor device is adapted to sense the vertical position of said top surface of said workpiece when said pressure foot is engaged with said back-up material and applying substantially the same downward force to said back-up material as during a drilling operation.

5. The drilling machine of claim 1, wherein said drill tool sensor device comprises:

means for sensing the absolute vertical position of said spindle; and a pressure foot depending from said spindle, said pressure foot having a bottom surface which is adapted to engage a workpiece, said pressure foot being movable relative to said spindle in a vertical direction; and a relative motion sensor which senses relative vertical motion between said spindle and said pressure foot.

6. The drilling machine of claim 5, wherein said drill tool sensor device further comprises means for sensing the position of a tip of said drill tool to accommodate for variations between a nominal position of said tool tip and an actual position of said tool tip.

7. The drilling machine of claim 6, wherein said tool tip position sensing means is adapted to determine the amount of offset between said tool tip from and said pressure foot bottom surface when relative motion between said pressure foot and said spindle commences.

8. The drilling machine of claim 1, wherein said means for controlling comprises a digital computer.

9. The drilling machine of claim 8, wherein said computer comprises said storage device.

10. The drilling machine of claim 1, wherein said back-up material sensor device is adapted to sense the vertical position of said back-up material top surface at a plurality of predetermined locations which form a grid.

11. A drilling machine in which the depth of a hole drilled completely through a workpiece can be precisely controlled to decrease drill wear and to improve the throughput of said drilling machine, said drilling machine comprising:

a spindle movable at least in a vertical direction, a drill tool removably mounted in said spindle, a tip of said drill tool being positioned a nominal distance from the bottom of said spindle, said spindle being adapted to cause rotation of said drill tool to effect drilling;

a vertical position sensor which senses the absolute vertical position of said spindle and drill tool;

a worktable positioned beneath said spindle, said worktable adapted to have a workpiece mounted thereon, said worktable being movable in at least one direction in a horizontal plane so as position said workpiece at desired locations beneath said spindle;

a back-up material having a top surface, said back-up mounted on top of said worktable with said top surface facing upwardly, toward said spindle so that workpieces mounted on said worktable are positioned directly in contact with said top surface of said back-up material;

a pressure foot mounted on said spindle and movable in a vertical direction relative to said spindle, a bottom surface of said pressure foot adapted to engage a workpiece which is mounted on said worktable, said drill tool passing through an aperture in said pressure foot during drilling operations;

a relative movement sensor which senses relative vertical movement between said spindle and said pressure foot, said relative movement sensor sensing movement of said pressure foot which occurs upon initial contact between said pressure foot bottom surface and a workpiece;

a computer controller which controls operation of said drilling machine, and which receives input from said vertical position sensor and said relative movement sensor and said vertical position sensor, said controller comprising:

a computer memory device for storing a map of data regarding the vertical position of said backup material top surface, said controller adapted to generate said data by engaging said pressure foot bottom surface directly with said back-up material top surface in a plurality of locations, said mapped data comprising, for each of said locations, the absolute vertical position of said spindle measured by said vertical position sensor at the point at which said relative movement sensor senses contact between said pressure foot bottom surface and said back-up material; and means for controlling the vertical displacement of said spindle during a drill stroke, said control means adapted to determine an absolute vertical position for said tool tip at a lower limit of a drill stroke and to terminate said drill stroke when said tool tip reaches said lower limit, said absolute vertical position being determined using the data regarding the vertical position of the back-up material top surface in said memory device, so that said lower limit is at least as deep as the vertical position of the top surface of said back-up material, so that drill penetration into said back-up material can be minimized, while at the same time ensuring that said drill tool has completely drilled through said workpiece, without requiring precise knowledge of the vertical position of the top of the workpiece or the thickness of the workpiece.

12. The drilling machine of claim 11, further comprising means for sensing the vertical position of a tip of said drill tool to determine any variation between said nominal distance from said tool tip and said spindle compared to the actual distance from said spindle and said tool tip.

13. A method of drilling a workpiece on a drilling machine, said drilling machine having a spindle movable at least in a vertical direction, a drill tool removably mounted in said spindle, said spindle being adapted to cause rotation of said drill tool to effect drilling; a worktable positioned beneath said spindle on which a workpiece can be mounted; and a back-up material having a top surface, said back-up mounted on top of said worktable with said top surface facing upwardly, toward said spindle so that workpieces mounted on said worktable are positioned directly in contact with said top surface of said back-up material, said method comprising the steps of:

sensing the vertical position of the back-up material top surface;

storing the data sensed regarding the vertical position of the top surface of the back-up material;

determining an absolute vertical position of the tool tip at a lower limit of a drill stroke, using the stored data regarding the vertical position of the back-up material top surface, so that the lower limit is a nominal distance below the back-up material top surface;

initiating a drill stroke by downward vertical motion of said spindle;

sensing the vertical position of the tip of the drill tool during the drill stroke; and terminating the drill stroke when said drill tool has reached said predetermined absolute vertical position so that drill penetration into said back-up material can be minimized, while at the same time ensuring that said drill tool has completely drilled through said workpiece.

14. The method of claim 13, wherein the vertical position of the top surface of said back-up material is sensed prior to positioning a workpiece on said back-up material.

15. The method of claim 13, wherein the vertical position of the top surface of the back-up material is sensed at a plurality of locations on the back-up material, said locations forming a grid.

16. The method of claim 13, further comprises the steps of:

prior to conducting a drill stroke, sensing the actual vertical position of the tip of the drill tool; and using said actual information regarding tool tip position in determining the absolute vertical position of the lower limit of a drill stroke.

17. A method of drilling a workpiece on a drilling machine, said drilling machine having a spindle movable at least in a vertical direction, a drill tool removably mounted in said spindle, said spindle being adapted to cause rotation of said drill tool to effect drilling; a worktable positioned beneath said spindle on which a workpiece can be mounted; and a back-up material having a top surface, said back-up mounted on top of said worktable with said top surface facing upwardly, toward said spindle so that workpieces mounted on said worktable are positioned directly in contact with said top surface of said back-up material, said method comprising the steps of:

mapping the top surface of the back-up material before mounting a workpiece on the back-up material so as to determine the vertical position of a plurality of locations on the back-up material top surface;

mounting a workpiece on the back-up material:

positioning the worktable relative to the spindle to permit drilling at a desired drill site on the workpiece;

determining an absolute vertical position of the tool tip at a lower limit of a drill stroke, using the mapped data regarding the vertical position of the back-up material top surface at a location on the back up material top surface proximate said drill site, said lower limit being set at a nominal distance below the back-up material top surface;

initiating a drill stroke by downward vertical motion of said spindle;

sensing the vertical position of the tip of the drill tool during the drill stroke; and terminating the drill stroke when said drill tool has reached said predetermined absolute vertical position, so that drill penetration into said back-up material can be minimized, while at the same time ensuring that said drill tool has completely drilled through said workpiece.

18. The method of claim 17, wherein said mapping is performed while applying substantially the same force to said worktable as is applied during a drill stroke.

19. The method of claim 17, further comprises the steps of:

prior to conducting a drill stroke, sensing the actual vertical position of the tip of the drill tool; and using said actual information regarding tool tip position in determining the absolute vertical position of the lower limit of a drill stroke.

* * * * *